(12) United States Patent
Fritz et al.

(10) Patent No.: US 7,609,051 B2
(45) Date of Patent: ***Oct. 27, 2009

(54) ENERGY METERING SYSTEM

(75) Inventors: Gerhard Fritz, Graz (AT); Erwin Schmalzl, Graz (AT)

(73) Assignee: Austriamicrosystems AG, Unterpremstätten (AU)

( * ) Notice: Subject to any disclaimer, the term of this patent is extended or adjusted under 35 U.S.C. 154(b) by 0 days.

This patent is subject to a terminal disclaimer.

(21) Appl. No.: 10/584,668

(22) PCT Filed: Nov. 12, 2004

(86) PCT No.: PCT/EP2004/012879

§ 371 (c)(1),
(2), (4) Date: May 15, 2007

(87) PCT Pub. No.: WO2005/066643

PCT Pub. Date: Jul. 21, 2005

(65) Prior Publication Data

US 2007/0279041 A1    Dec. 6, 2007

(30) Foreign Application Priority Data

Dec. 30, 2003   (DE) .............................. 103 61 664

(51) Int. Cl.
*G01R 21/00*   (2006.01)
*G01R 7/00*   (2006.01)
(52) U.S. Cl. .................... 324/142; 324/141; 324/103 R; 702/61
(58) Field of Classification Search ......... 324/141–142; 702/60–62
See application file for complete search history.

(56) References Cited

U.S. PATENT DOCUMENTS 4,408,283 A    10/1983   Kovalchik et al.

(Continued)

FOREIGN PATENT DOCUMENTS

CN    1266190    9/2000

(Continued)

OTHER PUBLICATIONS

Nagura, H. et al "Correction Method for a Single Chip Power Meter"; IMTC 1994, pp. 1313-1316 ISBN 0-7803-1880-3.

(Continued)

*Primary Examiner*—Ha Tran T Nguyen
*Assistant Examiner*—Emily Y Chan
(74) *Attorney, Agent, or Firm*—Fish & Richardson P.C.

(57) ABSTRACT

An energy consumption meter includes a first input for providing a first input signal derived from a voltage, a first analog-to-digital (A/D) converter electrically connected to the first input to generate a first output signal based on the first input signal, a second input for providing a second input signal derived from a current, a second A/D converter electrically connected to the second input to generate a second output signal based on the second input signal, a multiplier to combine signals corresponding to the first and second output signals, and a phase evaluation block having two inputs that are electrically connected to the first input and to the second input. The phase evaluation block measures a phase difference that corresponds to a phase difference between the first input signal and the second input signal. A phase correction block corrects for the phase difference in one of the first output signal and the second output signal.

20 Claims, 1 Drawing Sheet

U.S. PATENT DOCUMENTS

| | | | |
|---|---|---|---|
| 4,884,021 A | 11/1989 | Hammond et al. | |
| 5,017,860 A * | 5/1991 | Germer et al. | 324/142 |
| 5,545,981 A | 8/1996 | Dubin et al. | |
| 5,657,237 A * | 8/1997 | Mazzoni | 702/60 |
| 6,239,589 B1 | 5/2001 | Windsheimer | |
| 6,373,415 B1 | 4/2002 | King et al. | |
| 6,377,037 B1 * | 4/2002 | Burns et al. | 324/142 |
| 6,417,792 B1 | 7/2002 | King et al. | |
| 6,429,637 B1 | 8/2002 | Gandhi | |
| 6,496,783 B1 | 12/2002 | Maruyama | |
| 6,555,997 B1 | 4/2003 | De Vries et al. | |
| 7,474,087 B2 | 1/2009 | Fritz | |
| 2003/0042886 A1 | 3/2003 | Gandhi | |
| 2007/0200552 A1 | 8/2007 | Fritz | |

FOREIGN PATENT DOCUMENTS

| | | |
|---|---|---|
| CN | 1454317 | 11/2003 |
| CN | 100437128 | 11/2008 |
| DE | 2630959 | 1/1978 |
| DE | 2708075 | 8/1978 |
| DE | 3514371 | 10/1986 |
| DE | 689 20 984 | 7/1995 |
| DE | 692 28 850 | 10/1999 |
| DE | 198 42 241 | 4/2000 |
| DE | 695 21 939 | 4/2002 |
| DE | 101 62 259 | 7/2003 |
| EP | 0 634 662 | 1/1995 |
| EP | 0 534 583 | 4/1999 |
| GB | 1 563 677 | 3/1980 |
| GB | 1 575 148 | 9/1980 |
| GB | 2 319 345 | 5/1998 |
| JP | 59-042460 | 3/1984 |
| JP | 62-162917 | 7/1987 |

OTHER PUBLICATIONS

English translation of the International Preliminary Examination Report for PCT/EP2004/012879.

English Translation of the International Preliminary Report on Patentability in Application No. PCT/EP2005/002264, dated Feb. 8, 2007.

Action and Response history obtained from PAIR in U.S. Appl. No. 10/591,031, through Mar. 10, 2009.

* cited by examiner

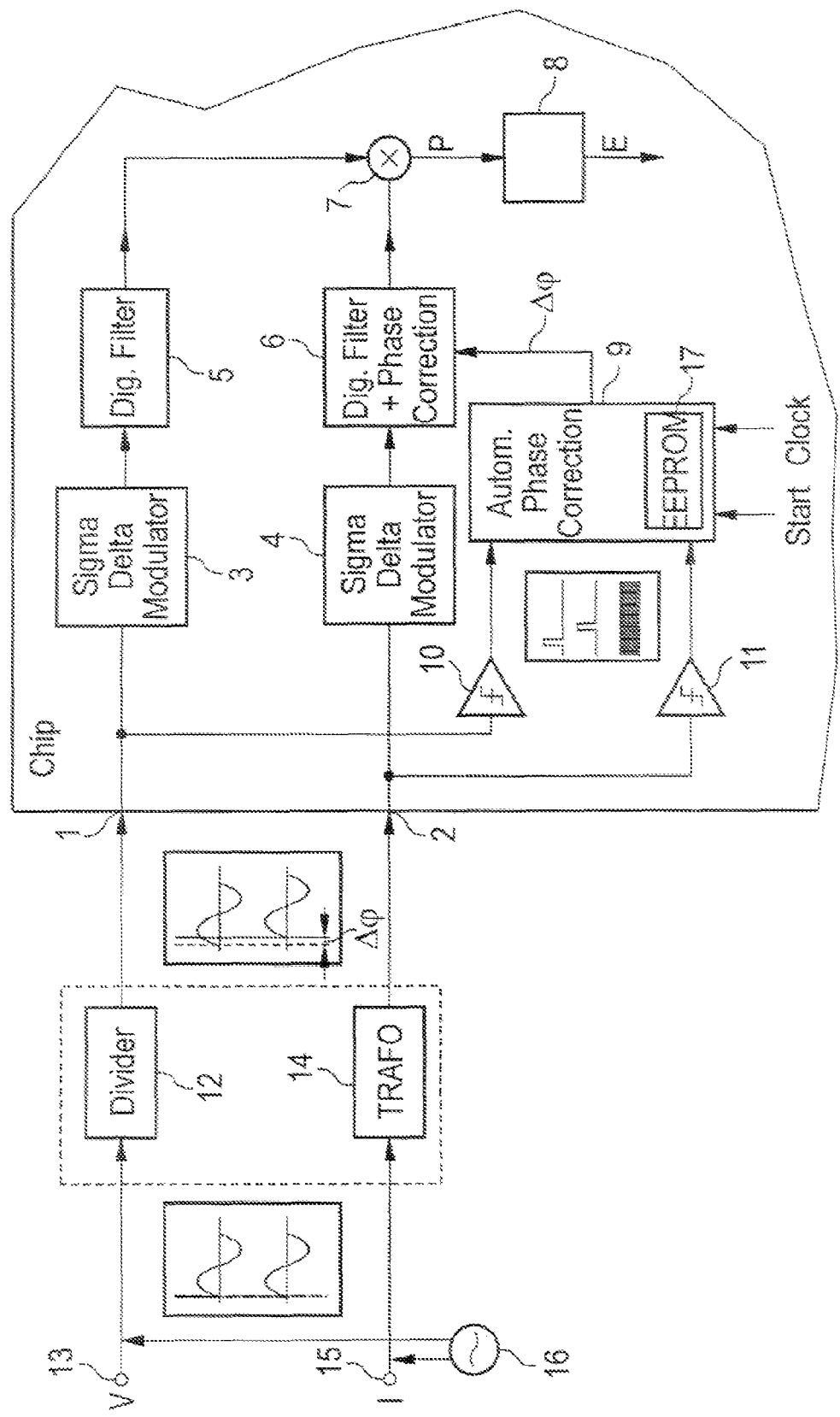

ENERGY METERING SYSTEM

TECHNICAL FIELD

The present invention relates to an energy consumption meter arrangement.

BACKGROUND

Energy consumption meters are used for detecting consumed or generated electrical energy. Such energy consumption meters are also referred to as electricity meters or kilowatt hour meters.

In the case of electronically operating energy consumption meters, voltage and current are normally detected, digitized and multiplied by one another. After the multiplication, the instantaneous electrical power is provided. If this electrical power is integrated or accumulated over time, a signal is obtained which is a measure of the electrical energy generated or consumed in a specific period of time.

In order to obtain signals which are proportional to electrical voltage and to electrical current, voltage dividers, voltage transformers, current transformers or other means for coupling out signals can be used.

In many applications it is necessary to provide DC isolation at least in one of the two channels for detecting voltage and current. Such a DC isolation of the circuits is provided by a transformer, for example.

One problem with such transformers, however, is the phase shift caused by the inductive coupling of the transformer. The phase shift results firstly between the output signal and the input signal of the transformer. Secondly, the phase shift also results between the signal representing the current and that representing the voltage, however.

This results in undesirable measurement errors during the multiplication of voltage and current, however. In this case it is necessary to take care that the voltage and current are generally not present in the form of DC signals, but rather in the form of AC signals having a more or less harmonic signal shape.

The described problem is further intensified, in addition, by the fact that, even when in each case one transformer-based transfer arrangement is inserted in the voltage and current measurement channel, an unpredictable phase shift between the two input channels may be caused by manufacturing tolerances, thermal effects, ageing effects etc.

In order to correct the undesirable phase shift described, for example RC networks which comprise resistors and capacitors could be used. However, these RC networks normally need to be in the form of additional external components and, disadvantageously, cannot normally be integrated. In addition, the problem of manufacturing-related and temperature-related tolerances is in principle not solved by this means.

SUMMARY

The object of the present invention is to provide an energy consumption meter arrangement which can be integrated with little complexity and with which the voltage and/or the current can be detected with DC isolation, without measurement errors resulting.

The object is achieved according to the invention by an energy consumption meter arrangement, having a first input for feeding a signal derived from a voltage, to which first input a first analog-to-digital converter is connected, a second input for feeding a signal derived from a current, to which second input a second analog-to-digital converter is connected, a multiplier, which combines the outputs of the two analog-to-digital converters with one another, a phase evaluation block having two inputs, which are coupled to the first and the second input of the energy consumption meter arrangement for the purpose of measuring a phase difference, and having an output, which is coupled to a phase correction block, and the phase correction block, which is coupled to an output of one of the two analog-to-digital converters, designed for correcting the phase difference of the digitized signal derived from a current or a voltage.

In accordance with the proposed principle, a phase shift between the input of the energy consumption meter arrangement, to which a signal derived from an electrical voltage is fed, and that input of the energy consumption meter arrangement to which a signal derived from an electrical current is fed is detected and compensated for. The signal inputs for feeding the signal derived from the voltage and the signal derived from the current may also be referred to as input channels, namely the voltage channel and the current channel.

It is advantageously possible with the proposed measurement and compensation of the phase shift between the two channels to DC-isolate the channels from one another and/or at least one input from the energy consumption meter arrangement. Owing to the compensation of the phase shift, measurement errors in the arrangement are avoided. In this case, no external compensation networks such as resistance/capacitance networks are advantageously required for phase-shifting purposes.

The phase evaluation block and the phase correction block advantageously bring about a so-called on-chip phase correction of the energy consumption meter arrangement without any external components.

For example, the phase difference between the two input channels can be measured in a calibration operating mode by an identical input signal being applied to the two inputs. A sinusoidal signal is preferably applied to the two inputs of the energy consumption meter arrangement in the calibration operating mode.

In this case, the zero crossings of the two signals, for example, can advantageously be compared by the phase evaluation block. It is thus possible to determine the relative time interval between the zero crossings. The calculation of the phase difference from the time interval of the zero crossings of the two signals can advantageously be brought about, for example, by means of a logic unit in the phase evaluation block. It is then easily possible using the determined phase difference to carry out a correction of precisely this phase difference in one of the two channels.

The phase correction value can advantageously be stored in the phase evaluation block in order that the correction value is also available during normal operation, after the calibration operating mode.

As a result of the fact that no external components are required for the phase correction, the implementation of the proposed energy consumption meter arrangement is advantageously possible in a very cost-effective manner. The proposed energy consumption meter arrangement which can be integrated is therefore particularly well suited to mass production.

An additional advantage is provided by the fact that the time required for calibrating the energy consumption meter arrangement on the basis of the proposed principle is particularly low. In principle, the phase difference between the two input channels can be determined within only one period of the input signal. The period can in this, case be calculated in a simple manner from the inverse value of the respective signal frequency. The signal frequency in the case of energy consumption meters is generally 50 hertz or 60 hertz, depending on the national standardization.

In accordance with the proposed principle, a phase difference between the input signals of the energy consumption meter arrangement, which are present in the form of analog signals, is detected. On the other hand, the phase error is corrected in the domain of the digital signal processing, i.e. after the analog-to-digital conversion of the input signals.

In order to achieve particularly rapid determination of the phase difference between the input channels of the energy consumption meter arrangement, it is advantageous to connect the clock input of the phase evaluation block to the clock inputs of the analog-to-digital converters and thus also to use the clock signal of the analog-to-digital converters for the phase evaluation, which clock signal is in any case required for the operation of the energy consumption meter arrangement.

The phase evaluation block advantageously comprises means for permanently storing a phase correction value. The means for permanently storing a phase correction value is preferably in the form of a nonvolatile memory, for example in the form of an EEPROM.

Owing to the permanent storage of the phase correction value, the phase correction value determined in a calibration operating mode is also still available after disconnection and reconnection of the energy consumption meter arrangement.

For the signal conditioning of the input signals to be fed to the phase evaluation block, it is advantageous to provide in each case one limiting amplifier which couples the first input and the second input of the energy consumption meter arrangement to associated inputs of the phase evaluation block.

The analog-to-digital converters are advantageously each in the form of sigma-delta converters or in the form of sigma-delta modulators. As a result, it is possible to sample the input signals derived from the voltage and current with a high degree of resolution and with good integrability.

An integrator which integrates the signal provided by the multiplier is advantageously provided at the output of the multiplier. The integrator can advantageously be in the form of an accumulator.

The integrator is advantageously designed such that it integrates the signal, which is provided by the multiplier and represents the instantaneous electrical power, to form a signal which is a measure of the consumed or generated electrical energy.

Further preferably, the first and the second analog-to-digital converters, the phase correction block and the phase evaluation block are designed using integrated circuit technology. The limiting amplifiers, the sigma-delta converters and further functional blocks and/or components in the signal-processing chain of the energy consumption meter arrangement can, if provided, advantageously be designed using integrated circuit technology. The energy consumption meter arrangement can advantageously be implemented in a single integrated semiconductor circuit.

The output of a transfer arrangement, which brings about DC isolation, can advantageously be connected to the first input of the energy consumption meter arrangement and/or to the second input of the energy consumption meter arrangement. Such a nonconductive transfer arrangement may advantageously be a transformer.

The comparatively great phase differences of such coupling elements, which bring about DC isolation of the inputs, can be compensated for in a particularly simple and effective as well as highly accurate manner using the proposed principle.

A means for generating a test signal is preferably provided which is coupled to the first and the second input of the energy consumption meter arrangement.

If coupling-in elements are provided, such as transformer-based transfer arrangements, the means for generating the test signal is advantageously designed such that the test signal is fed in at the input of the transfer arrangement or coupling-in element. In this case, it may be advantageous to make it possible for the inputs to be switched over between a useful signal operating mode and a calibration operating mode, in which the inputs are connected to the means for generating the test signal.

The means for generating the test signal can advantageously be activated in a calibration operating mode, whereas it can be deactivated in the normal operating mode, i.e. during actual energy measurement operation.

Further details and advantageous refinements of the proposed principle are the subject matter of the dependent claims.

The invention will be explained in more detail below using an exemplary embodiment with reference to the FIGURE, in which:

DESCRIPTION OF THE DRAWING

The FIGURE shows a block circuit diagram of an exemplary embodiment of the proposed energy consumption meter arrangement.

DETAILED DESCRIPTION

The FIGURE shows an energy consumption meter arrangement having a first input 1 and a second input 2. The first input 1 is designed for feeding a signal derived from an electrical voltage V. The second input 2 is designed for feeding a signal derived from an electrical current I. In this case, the electrical voltage V and the electrical current U are based on the same signal. The input of a first analog-to-digital converter 3 is connected to the first input 1. The input of a second analog-to-digital converter 4 is connected to the second input 2. The analog-to-digital converters 3, 4 are each in the form of sigma-delta modulators. The output of the first analog-to-digital converter 3 is connected to the input of a multiplier 7 via a first digital filter 5. The output of the second analog-to-digital converter 4 is connected to a further input of the multiplier 7 via a second digital filter 6. The second digital filter 6 comprises a phase correction block. An integrator 8 is connected to the output of the multiplier 7 and converts a signal, which is applied to its input and is a measure of the instantaneous electrical power P, into a signal which represents the electrical energy E. Furthermore, a phase evaluation block 9 having a first input and a second input is provided. The first input and the second input 1, 2 of the energy consumption meter arrangement are connected to the inputs of the phase evaluation block 9 by in each case one limiting amplifier 10, 11.

The phase evaluation block 9 comprises a nonvolatile memory 17, in which the measured phase difference or the associated correction value can be permanently stored.

In order to couple out the electrical voltage, a voltage divider 12 is provided, whose output is connected to the first input of the energy consumption meter arrangement, and whose input forms a voltage input 13 for feeding the electrical voltage. In order to couple out the electrical current, a transformer 14 is provided which is connected between a current input 15 and the second input 2 of the energy consumption meter arrangement. The transformer 14 provides DC isolation between the current input 15 and the second input 2.

The output of a test signal generator 16 is connected to the voltage input 13 and the current input 15. The test signal generator 16 provides a harmonic, for example sinusoidal signal having a rated frequency of 50 or 60 hertz.

Owing to the voltage divider 12 and the transformer 14, different phase shifts result for the two input channels of the energy consumption meter. Of particular significance is the relative phase difference $\Delta\phi$ between the two input channels at the inputs 1, 2 of the energy consumption meter arrangement. This phase difference $\Delta\phi$ is determined by the phase evaluation block 9. This takes place in a calibration operating mode owing to the fact that the test signal generator 16 is activated and, as a result, feeds in in each case one in-phase, sinusoidal signal at the voltage input 13 and the current input 15. This signal experiences a different phase shift in the voltage divider 12 and the transformer 14.

The relative phase difference $\Delta\phi$ at the inputs 1, 2 is determined in the phase evaluation block by the time span between the zero crossings of the two signals at the inputs of the phase evaluation block being detected and being converted into a corresponding phase difference. A corresponding correction value is output at the output of the phase evaluation block. A phase correction block is therefore driven in the digital filter 6 and precisely compensates for the phase difference $\Delta\phi$. The limiting amplifiers 10, 11 in the process improve the accuracy of the detection of the zero crossings.

The calibration operating mode is activated a single time when the energy consumption meter arrangement is produced.

The proposed principle provides automatic phase correction for integrated energy consumption meter arrangements which is completely integrated. The proposed energy consumption meter arrangement is also characterized by a low calibration time and low costs during production. In addition, DC isolation of at least one channel is possible at the input of the energy consumption meter arrangement, without measurement errors resulting. The DC isolation is particularly significant when more than one channel is measured, as is conventional in the case of electrical energy consumption meters.

In particular, it is possible to compensate for a phase shift which is unavoidably caused by transformers. In this case, no additional external components such as resistance-capacitance networks are required for phase correction purposes.

Owing to the nonvolatile memory 17, the phase correction value is also still available when the energy consumption meter has been switched off.

Since the determination of the phase difference is in principle possible within one period, particularly rapid calibration can be carried out using the proposed principle.

The phase evaluation block 9 advantageously has a clock input which is connected to the clock inputs of the sigma-delta modulators 3, 4. As a result, the clock edges between two zero crossings can be counted at the inputs 1, 2 and thus the phase difference can be determined in a simple and accurate manner.

In accordance with the proposed principle, the relative phase difference at the two inputs of the energy consumption meter arrangement is detected in the analog signal domain. The phase difference, however, is corrected in the digital signal-processing domain.

The invention claimed is:

1. An energy consumption meter comprising:
    a first input for providing a first input signal derived from a voltage;
    a first analog-to-digital converter electrically connected to the first input to generate a first output signal based on the first input signal;
    a second input for providing a second input signal derived from a current;
    a second analog-to-digital converter electrically connected to the second input to generate a second output signal based on the second input signal;
    a multiplier to combine signals corresponding to the first and second output signals;
    a phase evaluation block comprising two inputs, one of the two inputs being electrically connected to the first input and another of the two inputs being electrically connected to the second input, the phase evaluation block to measure a phase difference that corresponds to a phase difference between the first input signal and the second input signal, and the phase evaluation block comprising an output that is electrically connected to a phase correction block; and
    the phase correction block electrically connected to an output terminal of one of the first and second analog-to-digital converters, the phase correction block to correct for the phase difference in one of the first output signal and the second output signal.

2. The energy consumption meter of claim 1, wherein the phase evaluation block comprises means for permanently storing a phase correction value.

3. The energy consumption meter claim 1, further comprising:
    a first limiting amplifier to couple the first input to an input of the phase evaluation block; and
    a second limiting amplifier to couple the second input to an input of the phase evaluation block.

4. The energy consumption meter of claim 1, wherein the first and the second analog-to-digital converters comprise sigma-delta converters.

5. The energy consumption meter of claim 1, further comprising:
    an integrator electrically connected downstream of the multiplier relative to the first and second inputs.

6. The energy consumption meter of claim 1, wherein the first and the second analog-to-digital converters, the phase correction block, and the phase evaluation block are implemented using integrated circuit technology.

7. The energy consumption meter of claim 1, further comprising:
    a nonconductively coupling transfer arrangement for providing the first input signal and/or the second input signal to the first input and/or the second input, respectively.

8. The energy consumption meter of claim 7, wherein the nonconductively coupling transfer arrangement comprises a transformer.

9. The energy consumption meter of claim 1, further comprising:
    a test signal generator to generate a test signal, the test signal generator being electrically connected to the first input and to the second input.

10. The energy consumption meter of claim 1:
    wherein the first analog-to-digital converter is directly connected to the first input;
    wherein the second analog-to-digital converter is directly connected to the second input;

wherein the two inputs of the phase evaluation block are connected to the first input and to the second input via amplifiers;
wherein the output of the phase evaluation block is directly connected to the phase correction block; and
wherein the phase correction block is directly connected to the output terminal of one of the first and second analog-to digital converters.

11. The energy consumption meter of claim 1, further comprising:
a first digital filter to alter the first output signal; and
a second digital filter comprising the phase correction block, the second digital filter to alter the second output signal to compensate for the phase difference;
wherein the signals combined by the multiplier comprise output signals of the first digital filter and the second digital filter.

12. The energy consumption meter of claim 1, wherein at least one of the first input and the second input is DC-isolated from a signal source.

13. The energy consumption meter of claim 1, wherein the phase evaluation block comprises memory for permanently storing a phase correction value.

14. The energy consumption meter claim 13, further comprising:
a first limiting amplifier to couple the first input to an input of the phase evaluation block; and
a second limiting amplifier to couple the second input to an input of the phase evaluation block.

15. The energy consumption meter of claim 14, wherein the first and the second analog-to-digital converters comprise sigma-delta converters.

16. The energy consumption meter of claim 15, further comprising:
an integrator electrically connected downstream of the multiplier relative to the first and second inputs.

17. The energy consumption meter of claim 16, wherein the first and the second analog-to-digital converters, the phase correction block, and the phase evaluation block are implemented using integrated circuit technology.

18. The energy consumption meter of claim 17, further comprising:
a nonconductively coupling transfer arrangement for providing the first input signal and/or the second input signal to the first input and/or the second input.

19. The energy consumption meter of claim 18, wherein the nonconductively coupling transfer arrangement comprises a transformer.

20. The energy consumption meter of claim 19, further comprising a test signal generator to generate a test signal, the test signal generator being electrically connected to the first input and to the second input.

* * * * *

UNITED STATES PATENT AND TRADEMARK OFFICE
CERTIFICATE OF CORRECTION

PATENT NO. : 7,609,051 B2
APPLICATION NO. : 10/584668
DATED : October 27, 2009
INVENTOR(S) : Gerhard Fritz It is certified that error appears in the above-identified patent and that said Letters Patent is hereby corrected as shown below:

Column 6, Claim 3, Line 32:

After "meter" Insert --of--

Signed and Sealed this

Twenty-sixth Day of January, 2010

David J. Kappos
*Director of the United States Patent and Trademark Office*